(12) United States Patent
Kuzmanov

(10) Patent No.: US 12,183,381 B2
(45) Date of Patent: Dec. 31, 2024

(54) SELF-ADJUSTING REFERENCE CURRENT FOR A MEMORY

(71) Applicant: Ferroelectric Memory GmbH, Dresden (DE)

(72) Inventor: Georgi Kuzmanov, Dresden (DE)

(73) Assignee: Ferroelectric Memory GmbH, Dresden (DE)

( * ) Notice: Subject to any disclaimer, the term of this patent is extended or adjusted under 35 U.S.C. 154(b) by 35 days.

(21) Appl. No.: 17/659,798

(22) Filed: Apr. 19, 2022

(65) Prior Publication Data

US 2023/0335174 A1 Oct. 19, 2023

(51) Int. Cl.
*G11C 11/12* (2006.01)
*G11C 11/22* (2006.01)

(52) U.S. Cl.
CPC ...... *G11C 11/2273* (2013.01); *G11C 11/2275* (2013.01)

(58) Field of Classification Search
CPC .......... G11C 11/2273; G11C 11/2275
USPC ..................................... 365/189.15
See application file for complete search history.

(56) References Cited

U.S. PATENT DOCUMENTS

| 8,917,536 | B2* | 12/2014 | Jan .......................... G11C 11/16 365/210.1 |
| 10,978,129 | B1 | 4/2021 | Müller |
| 11,081,159 | B1 | 8/2021 | Jähne et al. |
| 11,189,331 | B1 | 11/2021 | Benoist et al. |
| 11,195,589 | B1 | 12/2021 | Ocker et al. |
| 11,393,518 | B1 | 7/2022 | Ocker |
| 11,443,792 | B1 | 9/2022 | Iqbal et al. |
| 11,475,935 | B1 | 10/2022 | Ocker |
| 11,508,426 | B1 | 11/2022 | Ocker |
| 11,710,519 | B2* | 7/2023 | Yeh ...................... G11C 11/4074 365/185.21 |
| 2012/0275222 | A1* | 11/2012 | Choi ...................... G11C 29/52 365/185.09 |
| 2019/0130956 | A1 | 5/2019 | Müller et al. |
| 2019/0130957 | A1 | 5/2019 | Müller |
| 2019/0325963 | A1 | 10/2019 | Noack |
| 2020/0027493 | A1 | 1/2020 | Müller et al. |
| 2020/0357455 | A1 | 11/2020 | Noack et al. |
| 2020/0357470 | A1 | 11/2020 | Noack |
| 2021/0005238 | A1 | 1/2021 | Müller |
| 2021/0082958 | A1 | 3/2021 | Mennenga et al. |
| 2021/0090662 | A1 | 3/2021 | Mennenga et al. |
| 2021/0091097 | A1 | 3/2021 | Mennenga |
| 2021/0125656 | A1 | 4/2021 | Müller |

(Continued)

*Primary Examiner* — Huan Hoang
(74) *Attorney, Agent, or Firm* — Husch Blackwell LLP

(57) ABSTRACT

Disclosed herein is a memory cell arrangement and method thereof for providing a reference read current for reading a plurality of memory cells. The memory cell arrangement includes a plurality of memory cells and one or more reference memory cells. The memory cell arrangement also includes a reference circuit that provides a reference read current for reading one or more of the plurality memory cells, wherein the reference circuit is connected to the one or more reference memory cells to generate the reference read current based on one or more reference currents from the one or more reference memory cells. The memory cell arrangement may also include a shifting circuit connected to the reference circuit, wherein the shifting circuit is configured to shift the reference read current.

17 Claims, 11 Drawing Sheets

(56) References Cited

U.S. PATENT DOCUMENTS

| | | |
|---|---|---|
| 2021/0217454 A1 | 7/2021 | Ocker |
| 2021/0312969 A1 | 10/2021 | Noack et al. |
| 2021/0327901 A1 | 10/2021 | Noack |
| 2021/0336534 A1 | 10/2021 | Iqbal et al. |
| 2022/0020776 A1 | 1/2022 | Mennenga et al. |
| 2022/0060105 A1 | 2/2022 | Iqbal |
| 2022/0122995 A1 | 4/2022 | Ocker et al. |
| 2022/0122996 A1 | 4/2022 | Ocker et al. |
| 2022/0122999 A1 | 4/2022 | Polakowski |
| 2022/0139437 A1 | 5/2022 | Ocker |
| 2022/0139931 A1 | 5/2022 | Ocker |
| 2022/0139932 A1 | 5/2022 | Polakowski |
| 2022/0139933 A1 | 5/2022 | Noack |
| 2022/0139934 A1 | 5/2022 | Muller |
| 2022/0139936 A1 | 5/2022 | Ocker |
| 2022/0139937 A1 | 5/2022 | Muller et al. |
| 2022/0172791 A1 | 6/2022 | Schenk |
| 2022/0173114 A1 | 6/2022 | Schenk |
| 2022/0189524 A1 | 6/2022 | Ocker |
| 2022/0199166 A1 | 6/2022 | Mennenga et al. |
| 2022/0270659 A1 | 8/2022 | Ocker |
| 2022/0277794 A1 | 9/2022 | Noack |
| 2022/0301643 A1* | 9/2022 | Funatsuki ............ G11C 11/2273 |
| 2022/0374202 A1 | 11/2022 | Villa et al. |
| 2022/0376114 A1 | 11/2022 | Müller |
| 2023/0041759 A1 | 2/2023 | Noack et al. |
| 2023/0046259 A1 | 2/2023 | Iqbal |
| 2023/0135718 A1 | 5/2023 | Minh et al. |
| 2023/0170029 A1 | 6/2023 | Sivero |
| 2023/0189531 A1 | 6/2023 | Muller |
| 2023/0189532 A1 | 6/2023 | Muller |
| 2023/0223066 A1 | 7/2023 | Muller |
| 2023/0247842 A1 | 8/2023 | Muller |
| 2023/0284454 A1 | 9/2023 | Ocker et al. |
| 2023/0335174 A1 | 10/2023 | Kuzmanov |
| 2023/0360684 A1 | 11/2023 | Sivero |
| 2023/0371268 A1 | 11/2023 | Muller |

* cited by examiner

SELF-ADJUSTING REFERENCE CURRENT FOR A MEMORY

TECHNICAL FIELD

Various aspects are related to computer memories, and in particular, circuits and methods for providing reference currents for a memory.

BACKGROUND

A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained (read out) by determining in which of the memory states the memory cell is residing. At present, various types of memory cells may be used to store data. By way of example, a type of memory cell may include a thin film of a spontaneous polarizable material, e.g., a ferroelectric material or a configuration of an anti-ferroelectric material, whose polarization state may be changed in a controlled fashion to store data in the memory cell, e.g. in a non-volatile manner. A memory cell or an array of memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
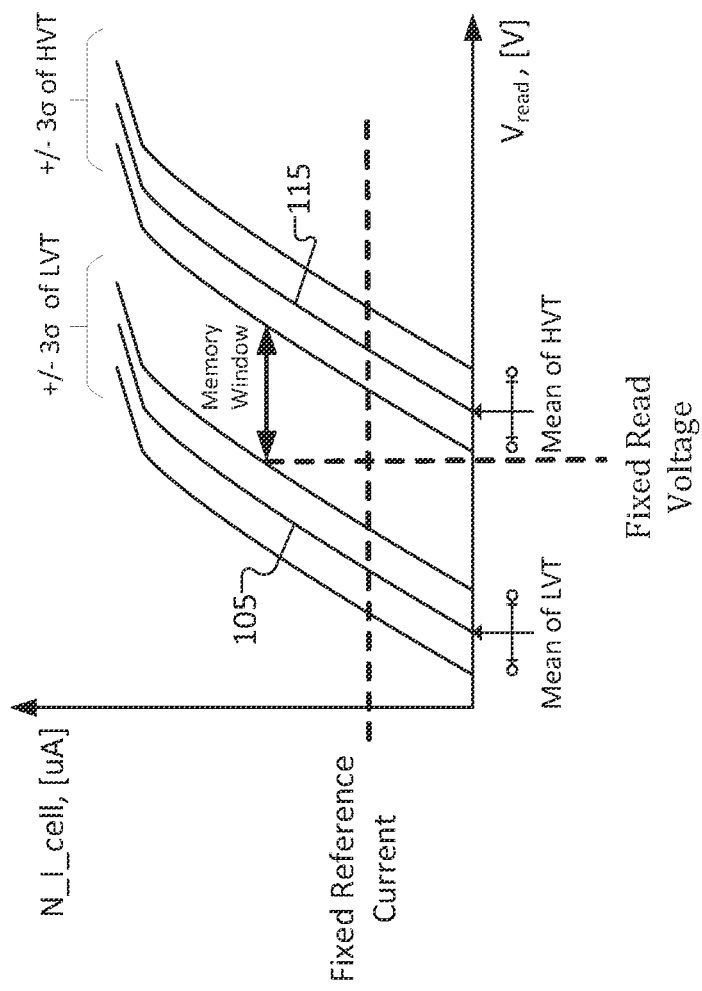
FIG. 1 shows an exemplary graph of current-voltage transfer characteristics of an array of memory cells.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a circuit, a memory, a memory cell, a memory element, a memory array, a reference sector, a dividing circuit, a shifting circuit, etc.). It should be understood that aspects described in connection with methods may similarly apply to devices and vice versa.

In memories, the switching behavior of a memory cell, illustratively the behavior of the memory cell when switching from one memory state to another memory state, plays an important role in defining its overall performance. The switching behavior of a memory cell (also called a memory element or state-programmable memory element) should be reliable and remain reliable over time, e.g. over the lifetime of the memory cell, and in different operating conditions, e.g., over different temperatures, to ensure that a user can write data into the memory cell and read data from the memory cell without errors or malfunctions. In the context of a polarization-based memory cell, e.g. a memory cell including a spontaneously-polarizable memory element, the reliability of the switching behavior may be related to the polarization behavior of the memory cell, e.g. may be related to the reliability of the switching of the polarization state of the memory element and overall to the polarization properties of the memory element. For example, the threshold voltage of a spontaneously-polarizable memory element may vary with temperature and/or over time. In memories where the reference read current and read voltage are fixed, for example, a variation in the threshold voltage may cause undesirable read failures.

According to various aspects, a memory element may provide or may be part of a memory cell. A memory cell may be provided, for example, by coupling a gate of a field-effect transistor structure with a capacitive memory structure, or by integrating a memory structure in the gate structure of a field-effect transistor structure. A memory cell may illustratively include a field-effect transistor structure and a capacitive memory structure coupled to or integrated in the field-effect transistor structure (optionally with one or more additional elements). In such a configuration, the functional layer (e.g., a capacitive memory element) may be in a capacitive environment, e.g., disposed between two electrode layers or disposed between a channel of a field-effect transistor and an electrode layer (e.g., a gate electrode of the field-effect transistor). In such a memory cell, the state (e.g., the polarization state) of the memory element influences the threshold voltage of the field-effect transistor structure (e.g., a first state of the memory element may be associated with a first threshold voltage, such as a low threshold voltage, and a second state of the memory element may be associated with a second threshold voltage, such as a high threshold voltage). A memory cell that includes a field-effect transistor structure and a capacitive memory structure may be referred to as a field-effect-transistor-based memory cell or a field-effect-transistor-based capacitive memory cell. It is noted that even though various aspects of a memory cell are described herein with reference to a field-effect transistor based capacitive memory structure (such as a FeFET), other memory structures may be suitable as well.

According to various aspects, a threshold voltage of a field-effect transistor structure (and in a corresponding manner, the threshold voltage of a field-effect-transistor-based memory cell) may be defined as a constant current threshold voltage (referred to as $V_{th}(ci)$). In this case, the constant current threshold voltage, $V_{th}(ci)$, may be a determined gate source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g. 0.1 μA. In some aspects, the constant current threshold voltage, $V_{th}(ci)$, may be determined based on the following equation:

$$V_{th}(ci)=V_{GS}(\text{at } I_D=I_{D0}\cdot W/L).$$

A threshold voltage of a field-effect transistor structure may be defined by the properties of the field-effect transistor structure (e.g., the materials, the doping, etc.), and it may thus be a (e.g., intrinsic) property of the field-effect transistor structure.

According to various aspects, a memory cell may have at least two distinct memory states associated therewith, for example with two distinct electrical conductivities or two distinct amounts of stored charge that may be determined to determine in which of the at least two distinct states the memory cell is residing in. A memory cell including a field-effect transistor structure may include a first memory state, for example, associated with a low threshold voltage state (referred to as the LVT state and associated with the LVT memory state), and a second memory state, for example, associated with a high threshold voltage state (referred to as the HVT state and associated with the HVT memory state). The high threshold voltage state may be, in some aspects, associated with a lower current flow during readout than the low threshold voltage state. The low threshold voltage state may be an electrically conducting state (e.g., associated with a logic memory state "1", also referred to as a memory state, programming state, or programmed state), and the high threshold voltage state may be an electrically non-conducting state or at least less conducting than the low threshold voltage state (e.g., associated with a logic memory state "0", also referred to as a memory state, programming state, or erased state). Of course, the definition of the LVT state and the HVT state and/or the definition of a logic "0" and a logic "1" and/or the definition of "programmed state" and "erased state" may be selected arbitrarily. Illustratively, the first memory state may be associated with a first threshold voltage of the FET-based memory cell, and the second memory state may be associated with a second threshold voltage of the FET-based memory cell.

According to various aspects, the remanent polarization of the memory element (e.g., the remanent polarization of a spontaneously-polarizable layer) may define the memory state a memory cell is residing in. According to various aspects, a memory cell may reside in a first memory state in the case that the memory element is in a first polarization state, and the memory cell may reside in a second memory state in the case that the memory element is in a second polarization state (e.g., opposite to the first polarization state, illustratively with the polarization pointing in an opposite direction). As an example, the polarization state of the memory element may determine the amount of charge stored in the capacitive memory structure. The amount of charge stored in the capacitive memory structure may be used to define a memory state of the memory cell. The threshold voltage of a field-effect transistor structure may be a function of the polarization state of the memory element, e.g. may be a function of the amount and/or polarity of charge stored in the capacitive memory structure. A first threshold voltage, e.g. a low threshold voltage $V_{L-th}$, may be associated with the first polarization state (e.g., with the first amount and/or polarity of stored charge), and a second threshold voltage, e.g. a high threshold voltage $V_{H-th}$, may be associated with the second polarization state (e.g., with the second amount and/or polarity of stored charge). A current flow from nodes to which the field-effect transistor structure and the capacitive memory structure are coupled may be used to determine the memory state in which the memory cell is residing in. As an example, the first polarization state may include a positive polarization, and the second polarization state may include a negative polarization.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state." For example, programming an n-type FET-based memory cell may modify the state the memory cell is residing in from the HVT state to the LVT state, whereas programming a p-type FET-based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state." For example, erasing an n-type FET-based memory cell may modify the state the memory cell is residing in from the LVT state to the HVT state, whereas erasing a p-type FET-based memory cell may modify the state the memory cell is residing in from the HVT state to the LVT state.

According to various aspects, a memory element of a memory cell (e.g., the memory element of a capacitive memory structure coupled to or integrated in a field-effect transistor structure) may include or may be made of a polarizable material, e.g., a spontaneously-polarizable material. A spontaneously-polarizable memory element (e.g., a spontaneously-polarizable layer) may show a hysteresis in the (voltage dependent) polarization. The spontaneously-polarizable memory element may show non-remanent spontaneous polarization (e.g., may show anti-ferroelectric properties), e.g., the spontaneously-polarizable memory element may have no or no substantial remanent polarization remaining in the case that no voltage drops over the spontaneously-polarizable memory element. In other aspects, the spontaneously-polarizable memory element may show remanent spontaneous polarization (e.g., may show ferroelectric properties), e.g., the spontaneously-polarizable memory element may have a remanent polarization or a substantial remanent polarization remaining in the case that there is no applied voltage drop over the spontaneously-polarizable memory element.

The terms "spontaneously polarized" or "spontaneous polarization" may be used herein, for example, with reference to the polarization capability of a material beyond dielectric polarization. A "spontaneously-polarizable" (or "spontaneous-polarizable") material may be or may include a spontaneously-polarizable material that shows a remanence, e.g., a ferroelectric material, and/or a spontaneously-polarizable material that shows no remanence, e.g., an anti-ferroelectric material. The coercivity of a material may be a measure of the strength of the reverse polarizing electric field that may be required to remove a remanent polarization.

A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristics of the polarization) may be analyzed using capacity spectroscopy, e.g., via a static (C-V) and/or time-resolved measurement or by polarization-voltage (P-V) or positive-up-negative-down (PUND) measurements.

According to various aspects, in various types of applications, e.g., in memory technology, a remanent polarization as low as 0 μC/cm² to 3 μC/cm² may be regarded as no substantial remanent polarization. Such low values of a remanent polarization may be present in a layer or material due to undesired effects, e.g., due to a not ideal layer formation. According to various aspects, in various types of applications, e.g., in memory technology, a remanent polarization greater than 3 μC/cm² may be regarded as substantial remanent polarization. Such a substantial remanent polarization may allow for storing information as a function of a polarization state of a spontaneously-polarizable layer or a spontaneously-polarizable material.

In general, a remanent polarization (also referred to as retentivity, remanence, or residual polarization) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. Therefore, the remanence of a material may be a measure of the remanent polarization in the material in the case that an applied electric field is removed. In general, ferroelectricity and anti-ferroelectricity may be concepts to describe a remanent polarization of a material, similar to ferromagnetism and anti-ferromagnetism used to describe remanent magnetization in magnetic materials. According to various aspects, an electric coercive field, $E_C$, (also referred to as coercive field) may be or represent the electric field required to depolarize a remanent-polarizable layer.

According to various aspects, a spontaneously-polarizable memory element may include or may consist of a remanent-polarizable material. A remanent-polarizable material may be a material that is remanently polarizable and shows a remanence of the spontaneous polarization, such as a ferroelectric material. In other aspects, a remanent-polarizable material may be a material that is spontaneously-polarizable and that shows no remanence, e.g., an anti-ferroelectric material under the additional conditions that measures are implemented to generate an internal electric-field within the anti-ferroelectric material. An internal electric-field within an anti-ferroelectric material may be caused (e.g., applied, generated, maintained, as examples) by various strategies: e.g., by implementing floating nodes that may be charged to voltages different from zero volts, and/or by implementing charge storage layers, and/or by using doped layers, and/or by using electrode layers that adapt electronic work-functions to generate an internal electric field, only as examples. A spontaneously-polarizable memory element including or being made of a remanent-polarizable material may be referred to herein as remanent-polarizable memory element (e.g., as remanent-polarizable layer).

In some aspects, a spontaneous-polarizable material (e.g., a remanent-polarizable material) may be based on at least one metal oxide. Illustratively, a composition of the spontaneous-polarizable material may include the at least one metal oxide for more than 50%, or more than 66%, or more than 75%, or more than 90%. In some aspects, the spontaneous-polarizable material may include one or more metal oxides. The spontaneous-polarizable material may include (or may be based on) at least one of $Hf_aO_b$, $Zr_aO_b$, $Si_aO_b$, $Y_aO_b$, as examples, wherein the subscripts "a" and "b" may indicate the number of the respective atom in the spontaneous-polarizable material.

In some aspects, the spontaneous-polarizable material (e.g., the remanent-polarizable material) may be or may include a ferroelectric material. Illustratively, a memory element may be a ferroelectric memory element (e.g., a ferroelectric layer). A ferroelectric material may be an example of a material used in a spontaneously-polarizable memory element (e.g., in a remanent-polarizable element). The ferroelectric material may be or may include at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. For example, the ferroelectric material may be doped at a concentration from about 2 mol % to about 6 mol %.

According to various aspects, a capacitive memory structure (e.g., the capacitive memory structure 120) may be or may include a ferroelectric capacitor (FeCAP) or an anti-ferroelectric capacitor (AFeCAP); or, in other aspects, a capacitive memory structure may include a ferroelectric capacitor or an anti-ferroelectric capacitor (AFeCAP), and one or more additional elements. According to various aspects, a capacitive memory structure may include a capacitive memory element, e.g., a ferroelectric layer, e.g., an anti-ferroelectric layer. Illustratively, a memory element of a memory structure (e.g., the memory element 124 of the memory structure 100) may include any type of spontaneously-polarizable material, e.g., a ferroelectric material, an anti-ferroelectric material, an anti-ferroelectric-like material, etc. Any information may be stored via at least two remanent polarization states of the capacitive memory structure. The programming of the capacitive memory structure (illustratively the storage of information therein) may be carried out by providing an electric field between the electrode layers to thereby set or change the remanent polarization state of the capacitive memory structure (illustratively, of the memory element). Illustratively, a spontaneous-polarizable material (e.g., a ferroelectric material, e.g. an anti-ferroelectric material) may be used to store data in a non-volatile manner in integrated circuits.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. According to various aspects, a non-volatile field-effect transistor based memory structure or memory cell may store data for a period of time from hours (e.g. more than 5 hours) to several tens of years (e.g. 10 years, 20 years, etc.), whereas a volatile field-effect transistor based memory structure or memory cell may store data for a period of time from nanoseconds to hours (e.g. less than 5 hours).

In comparison to other emerging memory technologies, a FeFET memory cell or a FeFET-based memory cell may be integrated in the Front-End-of-Line (FEOL) and/or in the Back-End-of-Line (BEoL) process flow, since it may be implemented as a transistor-type of memory. Accordingly, the integration of the FeFET memory cell or a FeFET-based memory cell may comply with a standard FEOL and/or BEOL complementary metal-oxide-semiconductor (CMOS) process flow. Consequently, various integration schemes may be used to integrate a FeFET or a FeFET-based memory cell in different process technologies, e.g., gate-first technologies, gate-last technologies, fully-depleted silicon-on-insulator (FDSOI) technologies, Fin-FET technologies, nanosheet technologies, nanowire technologies, as examples.

It may be understood that, even though various aspects refer to a memory element including or being made of a spontaneously-polarizable material, other memory elements whose state may be altered by an electric field provided across a capacitive memory structure may be used.

According to various aspects, a memory device may include one or more memory cells and a control circuit (also referred to herein as memory controller) to cause an operation of the one or more memory cells (e.g., a write operation and a readout operation). It is noted that some aspects are described herein with reference to a memory cell of a memory device; it is understood that a memory device may include a plurality of such described memory cells that can be operated in the same way by the memory controller, e.g., at the same time or in a time sequence. A memory device may further include respective sets of control lines and voltage supply levels configured to operate the one or more memory cells of the memory device.

In some aspects, a memory device may be or may include a memory cell arrangement (e.g., an array including a plurality of memory cells). A memory device may be operated based on one or more write operations (e.g., program and/or erase operations) and/or one or more readout operations. For example, during a write operation, predefined voltages may be provided to electrical lines (also referred to as control-lines or driver-lines), wherein the electrical lines may be connected to the respective nodes of the memory cells to allow for the desired operation. The electrical lines may be referred to, for example, as word-lines, source-lines, and/or bit-lines. One approach to program and/or erase a plurality of memory cells may be a one-third ($\frac{1}{3}$) voltage scheme. Such a $\frac{1}{3}$ voltage scheme may realize that one-third of a programming voltage (the programming voltage may be also referred to as write voltage) is only substantially exceeded at nodes corresponding to one or more memory cells that are intended to be programmed or erased. All memory cells that are not intended to be written may see a voltage that is at least substantially equal to or less than one-third of the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g., to provide the desired write voltages and/or the desired readout voltages. A readout operation may also be referred to herein as read operation.

It is noted that a memory cell arrangement may usually be configured in a matrix-type arrangement, wherein columns and rows define the addressing of the memory cells according to the control lines connecting respectively subsets of memory cells of the memory cell arrangement along the rows and columns of the matrix-type arrangement. In general, a memory cell arrangement may include a plurality of (e.g., volatile or non-volatile) memory cells, which may be accessed individually or in blocks, depending on the layout of the memory cell arrangement and/or the corresponding addressing scheme. For example, in a field-effect transistor (FET) based memory cell arrangement, the memory cells may be arranged in a matrix architecture (A(n,m)) including columns, for example a number n of columns, and rows, for example a number m of rows, with n and m being integer numbers greater than one. In the matrix architecture, each memory cell may be connected to control-lines (e.g., to one or more word-lines, to a bit-line, and to a source-line), which may be used to supply voltages to the memory cells for performing writing operations and readout operations. The matrix architecture may be, for example, referred to as "NOR" or "NAND" architecture, depending on the way neighboring memory cells are connected to each other (i.e., depending on the way the terminals of neighboring memory cells are shared), but are not limited to these two architectures. Another type is, for example, an "AND" architecture. However, other arrangements may be suitable as well.

The memory cell or the memory device described herein may be used in connection with any type of suitable memory controller, e.g., a memory controller that may generate only two or only three different voltage levels for writing the memory cell (e.g., for writing one or more memory cells of a memory device). However, in other aspects, more than four different voltage levels may be used for operating (e.g., for reading) the memory cell or for operating one or more memory cells of a memory device. A memory cell may have a narrow memory window (e.g., a small difference between the threshold voltages of a programmed state versus an erased state), which requires using a read voltage with considerable accuracy to ensure a proper read operation of the memory cell. Normally, the read voltage is generated by means of a voltage regulator that provides a stable voltage and stable current for biasing control lines (e.g., word-line) for reading the memory cell. Typically, the regulator would supply a fixed voltage having a fixed reference read current, and the fixed read voltage value may be configured (e.g., at the time the memory device is manufactured) so that the read voltage is (ideally) in the middle of the memory window for the given fixed reference read current.

Of course, a number of memory cells of a memory arrangement (e.g., a plurality of memory cells) may use the same supply voltage (e.g., for reading each memory cell). Because the transfer characteristics of each individual memory cell may vary from memory element to memory element (e.g., the current-voltage transfer characteristic of one cell may be different from the current-voltage transfer characteristic of another cell), the transfer characteristics of the memory array may be understood as having a distribution (e.g., variations in the transfer characteristic centered around a mean transfer characteristic). In such a case, the effective memory window may be understood to be even narrower, defined between an upper deviation in the mean transfer characteristic associated with the first programming state (e.g., $+3\sigma$ from the mean for memory cells programmed to the LVT state) and a lower deviation in the mean transfer characteristic associated with the second programming state (e.g., $-3\sigma$ from the mean for memory cells programmed to the HVT state).

For example, FIG. 1 depicts exemplary statistical deviations in a distribution of the current-voltage transfer characteristics for an array of memory cells when programmed to a first state (e.g., programmed to the LVT state) and when programmed to a second state (e.g., erased to the HVT state). Curve 105 represents the mean of the distribution of the LVT current-voltage transfer characteristics for the memory cells of the memory array that have been programmed to the LVT state. The current-voltage curves to the immediate left and right of curve 105 represent the $-3\sigma$ and $+3\sigma$ deviations, respectively, of the distribution. Curve 115 represents the mean of the distribution of the HVT current-voltage transfer characteristics for the memory cells of the memory array that have been programmed to the HVT state. The current-voltage curves to the immediate left and right of curve 115 represent the $-3\sigma$ and $+3\sigma$ deviations, respectively, of the distribution. Thus, the ideal memory window may be narrower than the distance from the mean LVT current-voltage transfer characteristic to the mean HVT current-voltage transfer characteristic, extending instead from the $+3\sigma$ deviation of the LVT current-voltage transfer characteristic to the $-3\sigma$ deviation of the HVT current-voltage transfer characteristic. As shown in FIG. 1, for a given fixed reference read current, the fixed read voltage may be configured to be in the middle of the memory window.

Figure 2:
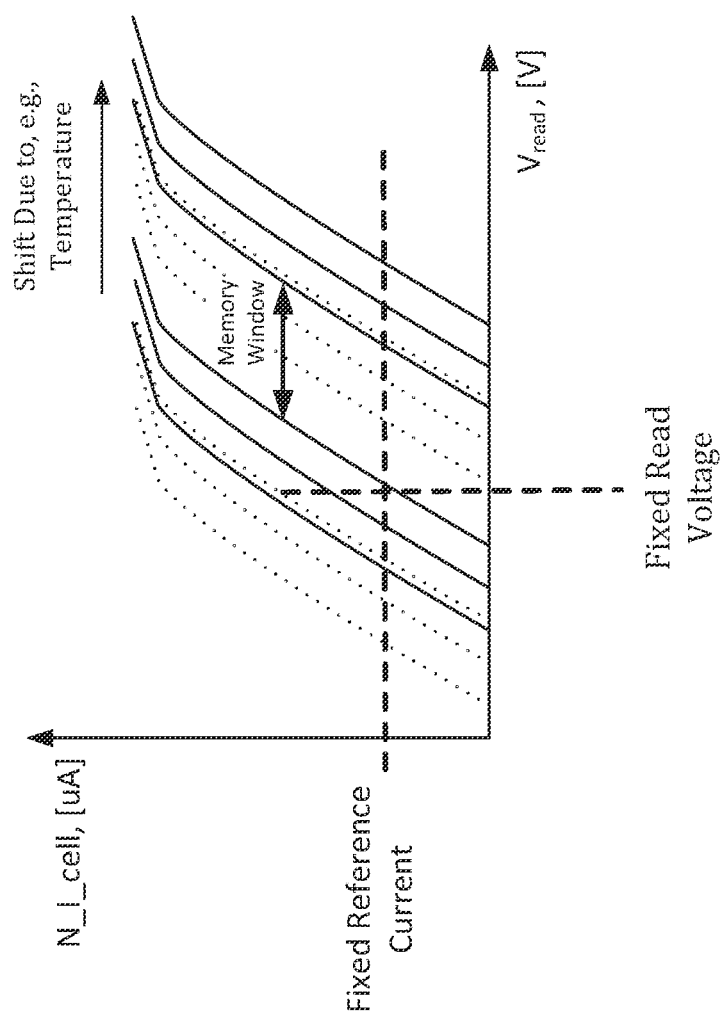
FIG. 2 shows an exemplary graph of current-voltage transfer characteristics of an array of memory cells that may shift depending on operating temperature.

During operation of a memory, however, the current-voltage transfer characteristics of the memory cells may change depending on operating conditions and/or over time. As the operating temperature of the memory changes, for example, the current-voltage transfer characteristics of the memory cells may also change. FIG. 2 depicts an exemplary change in the distribution of the current-voltage transfer characteristics at a different operating temperature as compared to FIG. 1. The dotted curves in FIG. 2 show a distribution of the current-voltage transfer characteristics for the memory from FIG. 1 at a first operating temperature, whereas the solid lines show a distribution of the current-voltage transfer characteristics for the memory at a second operating temperature, where the second operating temperature may be lower than the first operating temperature. As the example of FIG. 2 shows, the fixed read voltage at the fixed reference read current may no longer be centered within the memory window at this particular operating temperature. As the read voltage moves away from the center of the memory window (e.g., to the edges of the memory window or outside the memory window), read errors may be more likely to occur.

Figure 3:
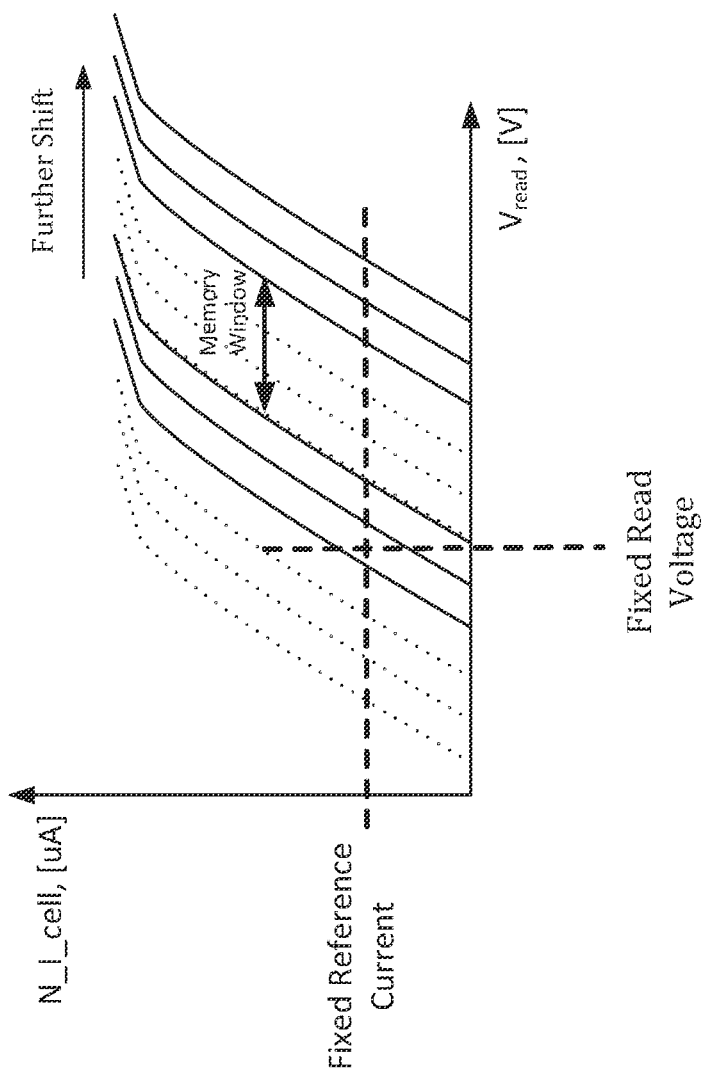
FIG. 3 depicts an exemplary graph of current-voltage transfer characteristics of an array of memory cells that may shift depending on operating temperature and other operational factors over time.

In addition, as the memory cells are operated over time (e.g., read, written, re-read, re-written, etc.), the current-voltage transfer characteristics may change. FIG. 3 depicts how the distribution of the current-voltage transfer characteristics may further shift due to the combined influence of many different conditions (e.g., operating temperature variations combined with other operating variations over time), where the memory window for the current operating conditions may have shifted (e.g., the solid lines show the distribution of current-voltage transfer characteristics under the current operating conditions of FIG. 3 as compared to the dotted lines that show the distribution of current-voltage transfer characteristics under the operating conditions of FIG. 1) such that the fixed read voltage at the fixed reference read current may be well outside the now-shifted memory window. In such a situation, read errors are even more likely to occur.

As discussed in more detail below, the disclosed memory arrangement may solve the-above described problems associated with a shifting memory window by providing a reference read current that is sourced from reference memory cells (e.g., in a reference sector) of the memory arrangement (e.g., the memory includes the reference memory cells for providing the reference current as well as the memory cells for storing/reading values in the memory). By utilizing reference currents generated from reference memory cells of the memory arrangement, a reference read current may be generated that automatically adjusts to different operating conditions in the same way that the transfer characteristics of the memory cells may vary. As a result, the read voltage may advantageously remain better aligned within the memory window, even as operating conditions of the memory changes.

To generate a reference read current for reading the memory cells of the memory, a number of memory cells of the memory may be used as reference memory cells (e.g., one, two, three, more than three, etc.). Each of the reference memory cells may be programmed to a remanent programming state (e.g., to the LVT state or the HVT state). As should be appreciated, any combination of programming states may be used (e.g., all of the reference memory cells may be programmed to the LVT state, all of the reference memory cells may be programmed to the HVT state, some of the reference memory cells may be programmed to the LVT state with others programmed to the HVT state, etc.). Then, reference currents from the as-programmed reference memory cells may be collected into a common current node (e.g., a reference current node or an averaging node) that is then averaged (e.g., by a reference/dividing circuit) to provide the reference read current for reading the memory cells. Any number of memory cells may be used as the reference memory cells, and the reference memory cells may be selected so as to reflect the mean of the distribution of the transfer characteristics of the memory cells being read. In this way, the reference read current may self-adjust to different operating conditions in the same way that the transfer characteristics of the memory cells being read may vary with the different operating conditions and/or over time.

Optionally, the circuit may include a shifting circuit for adjusting the collected reference current by a predefined amount as may be appropriate for centering the transfer characteristics of the resulting reference read current within the memory window. Shifting may be helpful because dividing/averaging the collected reference current may alter the slope of the current-voltage transfer characteristic of the resulting reference read current. As a result, a portion of the current-voltage transfer curve for the averaged current may be close to the edge of or outside of the memory window. For example, the "starting" voltage of the current-voltage transfer characteristic (e.g., the voltage at which the line crosses the X-axis) may fall within the distribution of voltages for the LVT distribution (e.g., within the ±3σ deviation for the LVT-programmed memory cells), which means that some portion of the LVT-programmed memory cells may be read incorrectly during a read operation. Thus, a shifting circuit may be used to provide a shift current that shifts the averaged current such that the "starting" voltage of its current-voltage transfer characteristic is moved outside of the LVT distribution so that the read voltage is better centered within the memory window.

Figure 4:
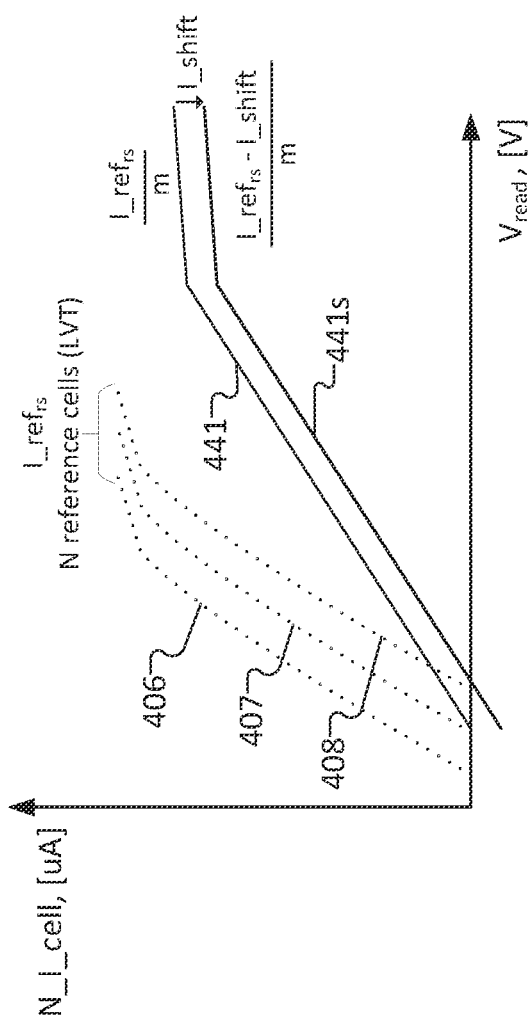
FIG. 4 depicts an exemplary graph of current-voltage transfer characteristics of reference memory cells that are used to generate a reference read current.

For example, FIG. 4 shows an example of how a number of reference currents may be averaged and optionally shifted to provide a reference current. Curves 406, 407, and 408 show the distribution of the current-voltage transfer characteristics of a number (N) of reference memory cells that have been programmed to the LVT state. These reference memory cells may have been selected to match the distribution of the current-voltage transfer characteristics of the memory cells of the memory, centered at the mean of the distribution. Reference currents associated with these reference memory cells may be collected into a common current (e.g., $I\_ref_{rs}$) and averaged (e.g., by a reference/dividing circuit) to provide an averaged reference current $$\left(e.g., \frac{I\_ref_{rs}}{m}\right)$$

having the current-voltage transfer characteristic curve 441, where m may be understood as an averaging factor. As can be seen when comparing the current-voltage transfer characteristic curve 441 of the averaged reference current to current-voltage transfer characteristic curves 406, 407, and 408 for the individual reference memory cells, the averaging has changed the slope of the resulting transfer characteristic. The "starting" voltage of the current-voltage transfer characteristic curve 441 (e.g., the voltage at which the curve intercepts the x-axis, e.g., where the current is zero) falls within the distribution of voltages for the LVT distribution (e.g., within the ±3σ deviation for the LVT memory cells represented by current-voltage transfer characteristic curves 406, 407, and 408). A shift current (e.g., I_shift) may be used to shift the current-voltage transfer characteristic of the averaged current such that the shifted "starting" voltage is outside of the LVT distribution (e.g., represented by current-voltage transfer characteristic curve 441).

Figure 5:
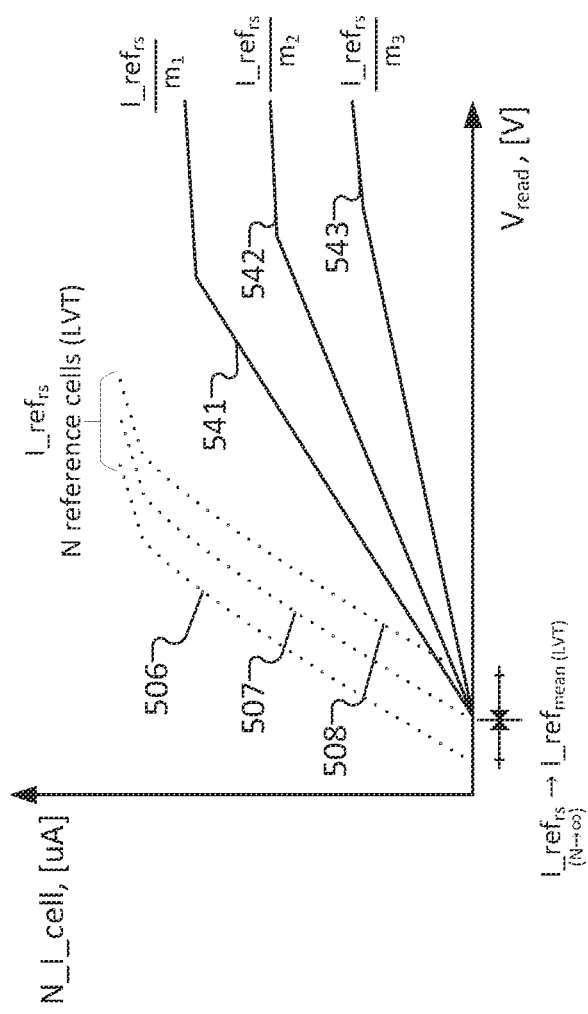
FIG. 5 illustrates an exemplary graph of current-voltage transfer characteristics of reference memory cells that are used to generate a reference read current.

FIG. 5 shows how the averaging factor m may impact the slope of the current-voltage transfer characteristic of the resulting averaged current. Similar to FIG. 4, curves 506, 507, and 508 show the distribution of the current-voltage transfer characteristics of a number (N) of reference memory cells that have been programmed to the LVT state. These reference memory cells may have been selected to match the distribution of the current-voltage transfer characteristics of the memory cells of the memory, centered at the mean of the distribution. As should be appreciated, as the number of reference memory cells increases, the current-voltage transfer characteristic of the resulting reference current should approach the mean of the distribution of current-voltage transfer characteristics for the memory. Different averaging factors (e.g., $m_1$, $m_2$, $m_3$, etc.) may be used to average the combined currents from the reference cells, where the slope of the resulting current-voltage transfer characteristic curve may depend on the averaging factor. As shown in FIG. 5, a current-voltage transfer characteristic curve 541 may be associated with an averaging factor $m_1$, a current-voltage transfer characteristic curve 542 may be associated with an averaging factor $m_2$, and a current-voltage transfer characteristic curve 543 may be associated with an averaging factor $m_3$, each of which has a different slope. As discussed in the previous paragraph, the reference current may be additionally shifted (not shown) with a shift current so that the resulting current-voltage transfer characteristic (e.g., curves 541, 542, 543) is moved outside of the LVT distribution. As should be appreciated, as used herein, the term "average" or "averaging" is not meant to be limited to a strict mathematical mean, where a sum of individual values are divided by the number of values summed. Instead, the average may be obtained by, for example, summing individual values and dividing the sum by an averaging factor that need not be equal to the number of values combined. Thus, averaging should simply be understood as generating from individual values a number that is representative of the set individual values.

Figure 6:
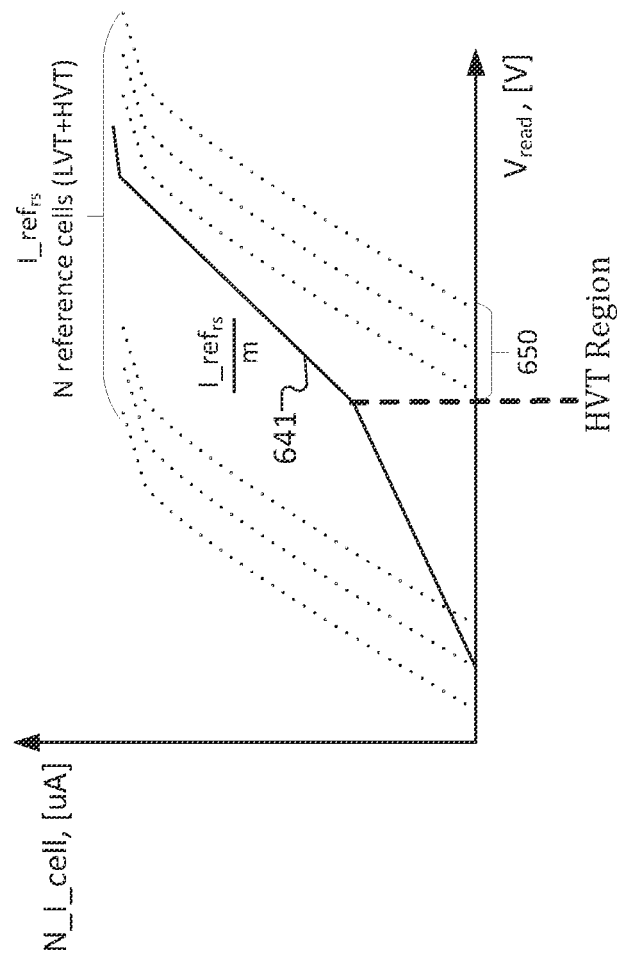
FIG. 6 illustrates an exemplary graph of current-voltage transfer characteristics of reference memory cells that are used to generate a reference read current.

As noted earlier, each reference memory cell of the one or more reference memory cells may be programmed to a remanent programming state (e.g., to the LVT state or the HVT state). Although the examples discussed above with respect to FIGS. 4-5 used reference memory cells programmed to the LVT state, the set of reference memory cells may be programmed to any combination of programming states (e.g., all of the reference memory cells may be programmed to the LVT state, all of the reference memory cells may be programmed to the HVT state, some of the reference memory cells may be programmed to the LVT state while others may be programmed to the HVT state, etc.). FIG. 6 shows an example where the reference elements include reference elements programmed to the LVT state and reference elements programmed to the HVT state. As shown in FIG. 6, the resulting current-voltage transfer characteristic curve 641 for the combined and averaged reference current $$\left(e.g., \frac{I\_ref_{rs}}{m}\right)$$

may have a different shape as compared to the resulting current-voltage transfer characteristic curves when only LVT-programmed reference memory cells are used (e.g., as in the examples of FIGS. 4-5). When HVT-programmed reference memory cells are included in the reference sector, the current-voltage transfer characteristic curve of the resulting current will never cross into the distribution 650 for the current-voltage transfer characteristics associated with HVT-programmed memory cells.

Figure 7:
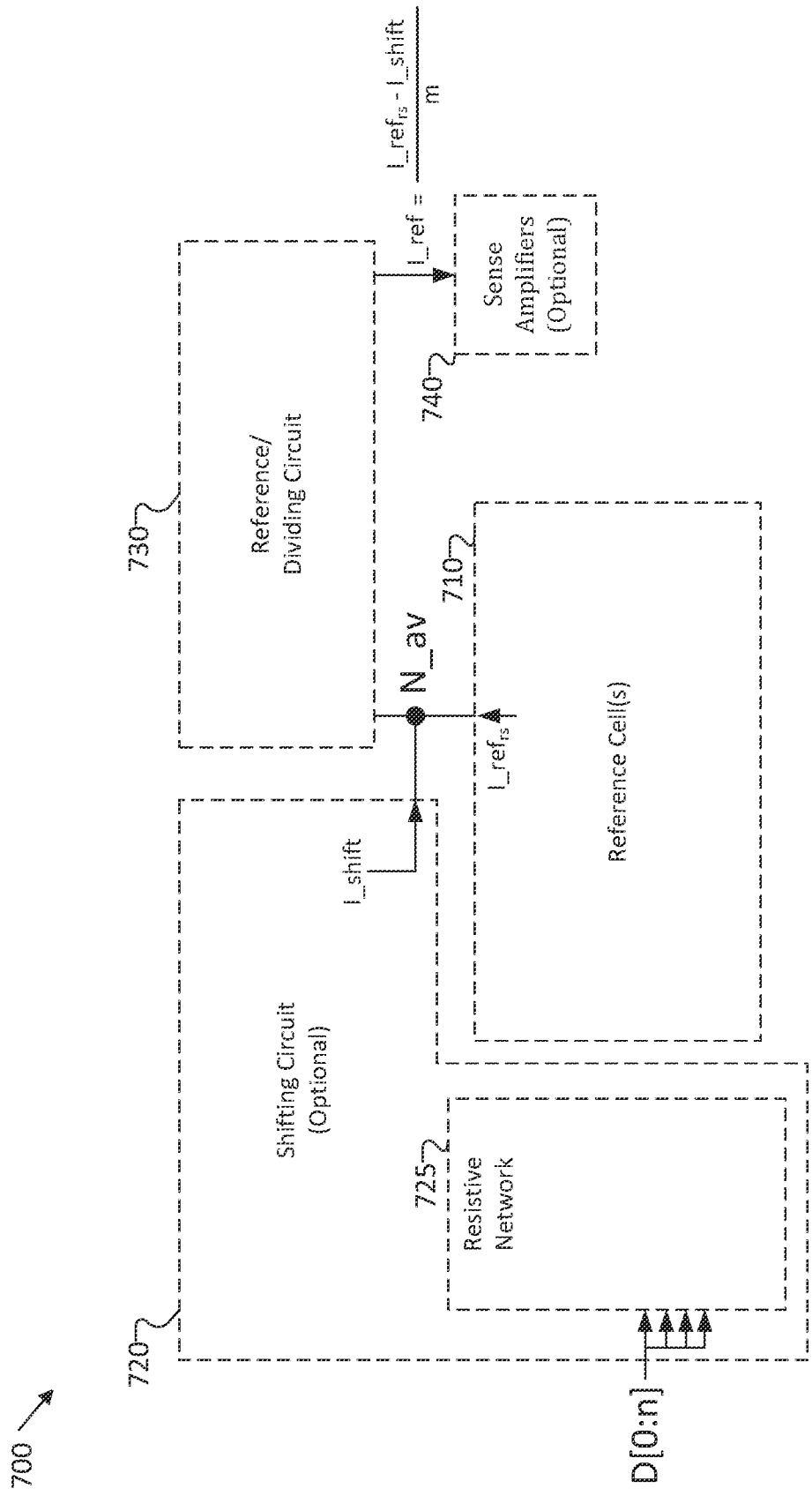
FIG. 7 shows an exemplary memory arrangement that may include a reference/dividing circuit to provide a reference read current from reference memory cells and, optionally, a shift current from a shifting circuit.

FIG. 7 shows a memory 700 that includes circuitry for generating a reference current and for providing the reference current to sense amplifiers 740 of an array of memory cells of the memory 700. The circuitry may include reference cell(s) 710 that include one or more reference memory cells of memory 700 whose individual reference currents are collected together (e.g., at the N_av node), averaged by the reference/dividing circuit 730, and then optionally provided as a reference current to the sense amplifiers 740 for reading the memory cells of the memory 700. The circuitry may optionally include a shifting circuit 720 for injecting a shift current (e.g., I_shift) into the averaging node (e.g., N_av) to shift the transfer characteristic of the resulting reference current (e.g., so that the current-voltage transfer characteristic of the resulting reference current is moved so that the read voltage is better centered within the memory window). The shifting circuit 720 may include a resistive network 725 that may be adjusted using a resistor selection signal (e.g., via control signal line(s) D[0:n]). If a shift current is provided, the output of the reference/dividing circuit 730 may be shifted by the shift current (I_shift) such that the output reference current (I_ref) may be $$\frac{I\_ref_{rs} - I\_shift}{m}.$$

By utilizing a reference current generated from reference cell(s) 710 that include one or more reference memory cells that are on the same memory 700 and biased in the same way as the memory cells, the generated reference current may automatically adjust to different operating conditions in the same manner as the memory cells of the memory array. As a result, the read voltage may advantageously remain better aligned within the memory window, even as operating conditions of memory 700 changes.

Figure 8:
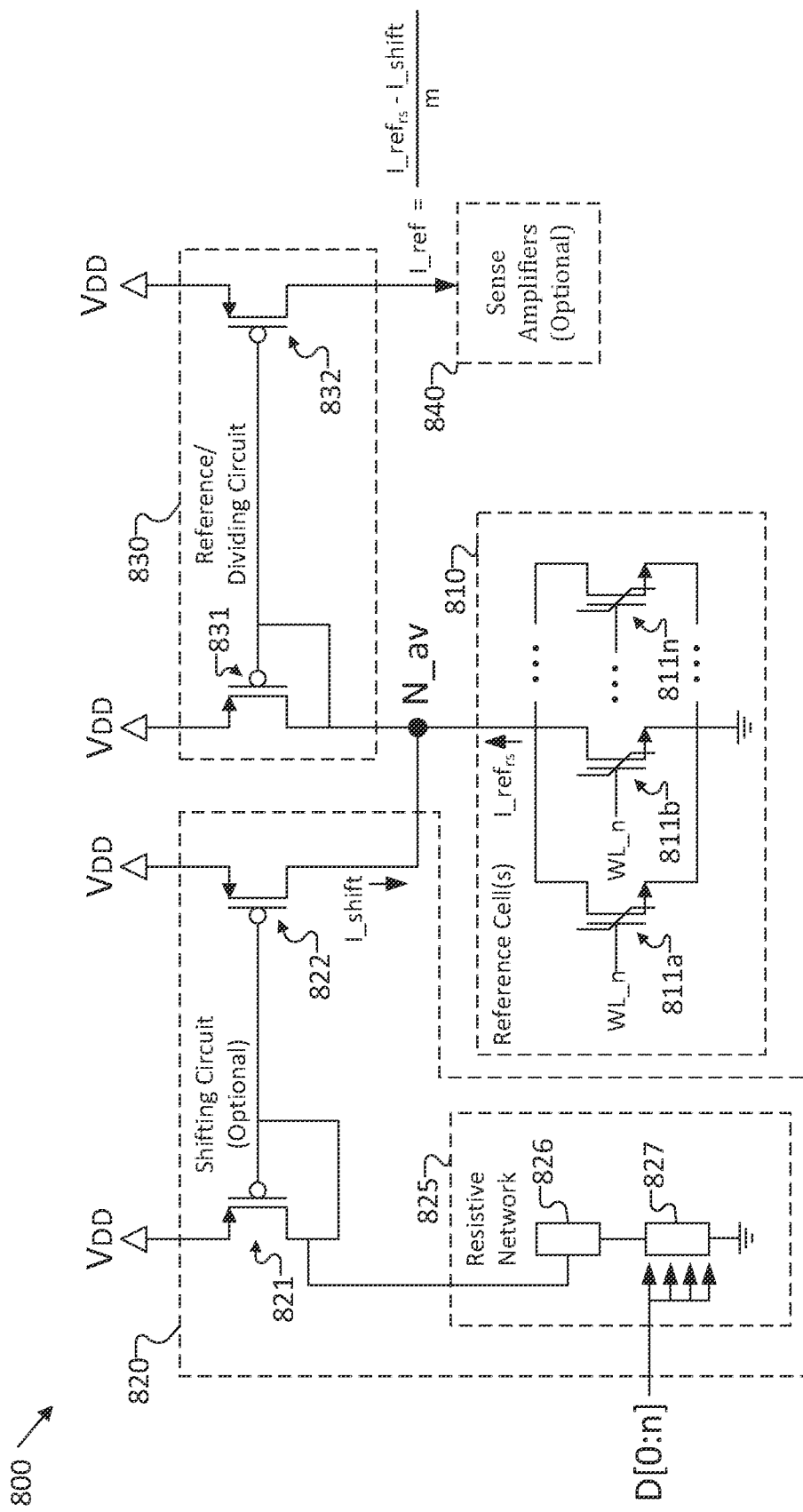
FIG. 8 shows an exemplary memory device that may include a reference/dividing circuit to provide a reference read current from reference memory cells and, optionally, a shift current from a shifting circuit.

FIG. 8 shows a memory 800 that includes circuitry for generating a reference current and for (optionally) providing the reference current to sense amplifiers 840 of an array of memory cells of the memory 800. Memory 800 may be an exemplary embodiment of the memory 700 described above with respect to FIG. 7. It should be appreciated that memory 800 is merely exemplary, and this example is not intended to limit memory 700, which may be implemented in any number of ways.

Memory 800 may include reference cell(s) 810 that include a number of reference memory cells 811a, 811b, ..., 811n of memory 700 whose individual reference currents are collected together (e.g., at the N_av node), averaged by the reference/dividing circuit 830, and then optionally provided as a reference current to the sense amplifiers 840 for reading the memory cells of the memory 800. Though three reference memory cells are shown as the reference cell(s) 810, it should be appreciated that any number of reference memory cells may be used (e.g., one, two, three, more than three, etc.). As should also be appreciated, the number of memory cells and which memory cells are included as reference memory cells in reference cell(s) 810 may be selected so that, when combined, the current-voltage transfer characteristic of the reference cell(s) 810 approximates the mean of the distribution of the current-voltage transfer characteristics of the memory cells of the memory 800. Together, the reference cell(s) 810 may be understood as a reference sector.

Each reference memory cell 811a, 811b, ..., 811n of the reference cell(s) 810 may be or include a state-programmable memory element that is programmable between at least two programming states (e.g., a state corresponding to a logic "1" and a state corresponding to a logic "0"). For example, each reference memory cell 811a, 811b, ..., 811n may be or include a spontaneously-polarizable memory element (e.g., a FeFET memory cell or a FeFET-based memory cell) as described above that is remanently-programmable to a first memory state (e.g., associated with a low threshold voltage state (referred to as the LVT state and associated with the LVT memory state)) or a second memory state (e.g., associated with a high threshold voltage state (referred to as the HVT state and associated with the HVT memory state)). Any combination of programming states may be used for the reference cell(s) 810 (e.g., all of the reference memory cells 811a, 811b, ..., 811n may be programmed to the LVT state, all of the reference memory cells 811a, 811b, ..., 811n may be programmed to the HVT state, some of the reference memory cells may be programmed to the LVT state with others programmed to the HVT state, etc.).

The reference currents associated with each reference memory cell 811a, 811b, ..., 811n of the reference cell(s) 810 may be collected together (e.g., I_ref$_{rs}$ provided to the N_av node) and averaged by the reference/dividing circuit 830 to provide an averaged reference current as the reference current (I_ref) for the sense amplifiers 870. The reference/dividing circuit 830 may apply an averaging factor (e.g., m) to average the collected references currents such that the output reference current of the reference/dividing circuit 830 (I_ref) may be $$\frac{I\_ref_{rs}}{m}.$$

As shown in FIG. 8, the reference/dividing circuit 830 may be implemented using two transistors (e.g., transistor 831 and transistor 832) in a current mirror configuration, where the ratio between the widths of the two transistors 831, 832 define the averaging factor m.

The circuitry may optionally include a shifting circuit 820 for injecting a shift current (e.g., I_shift) into the averaging node (e.g., N_av) to shift the transfer characteristic of the resulting reference current (e.g., the current-voltage transfer characteristic of the resulting reference current is moved so that the read voltage is better centered within the memory window). The shifting circuit 820 may include two transistors (e.g., transistors 821 and 822) in a current mirroring configuration that inject the shift current into the averaging node. The shifting circuit may use a resistive network 825 to set the shift current, and the resistive network 825 may be adjustable using a resistor selection signal (e.g., via control signal line(s) D[0:n]). For example, the resistive network 825 may use a resistive element to set the shift current or a series of resistive elements (e.g., resistive element 826 and configurable resistive element 827) that together set the shift current. For example, resistive element 827 may be a variable resistive element that may be configured using a resistor selection signal (e.g., via the one or more control signal line(s) D[0:n]) that sets the variable resistivity of resistive element 827. If a shift current is provided, the input to the reference/dividing circuit 830 may be shifted by the shift current (I_shift) such that the output reference current (I_ref) may be $$\frac{I\_ref_{rs} - I\_shift}{m}.$$

Figure 9:
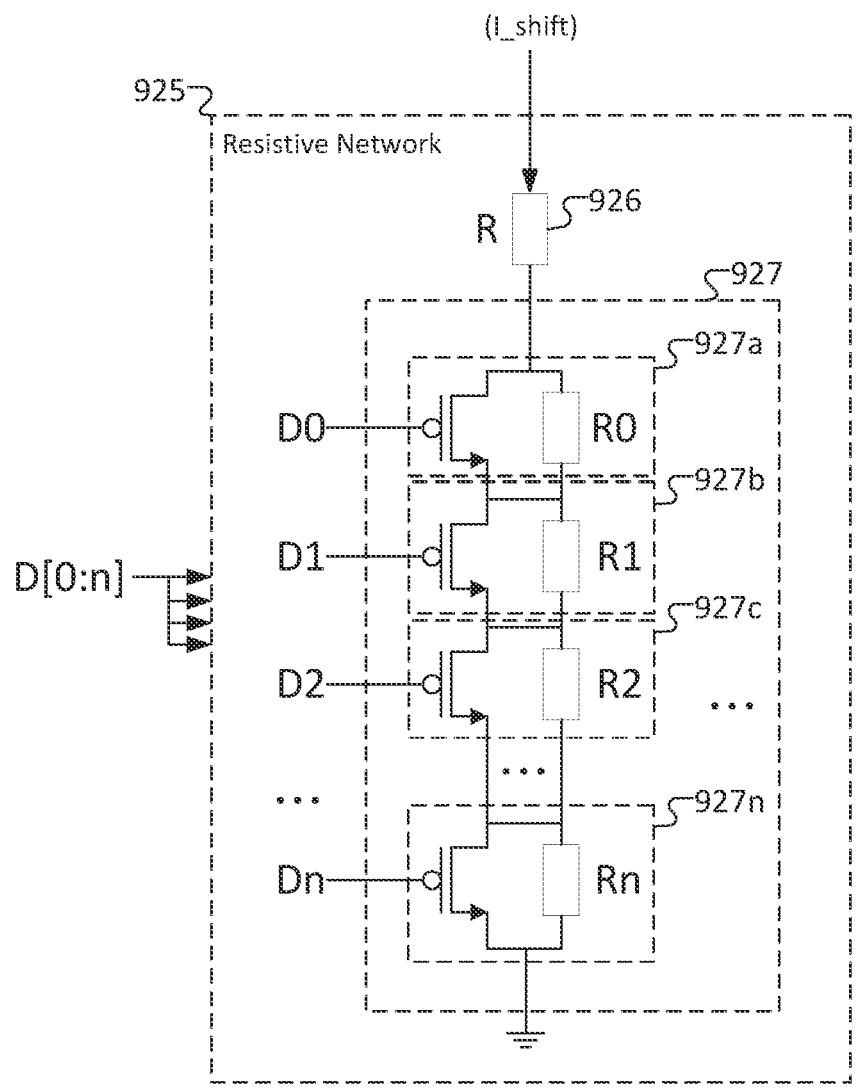
FIG. 9 shows an exemplary resistive network that may be used for providing a shift current for a reference read current of a memory arrangement.

FIG. 9 shows an exemplary resistive network 925 that may be an implementation of the resistive network 725 of FIG. 7 or the resistive network 825 of FIG. 8, each of which may be used to set the shift current (I_shift). It should be appreciated that resistive network 925 is merely exemplary, and this example is not intended to limit resistive network 725 or resistive network 825, which may be implemented in any number of ways.

The resistive network 925 may include any number of resistive elements (e.g., resistive element 926 and resistive element 927). The resistive elements may include an adjustable resistance that may be adjusted using a resistor selection signal (e.g., via control signal line(s) D[0:n]). For example, the resistive network 925 may use as resistive element 926 a fixed resistance (e.g., R) and/or a variable resistive element 927 consisting of a series of switchable circuits (e.g., 927a, 927b, 927c, . . . , 927n) that may switch a corresponding resistance (e.g., R0, R1, R2, . . . , Rn, respectively) into or out of the resistive network 925. For example, the switchable circuits 927a, 927b, 927c, . . . , 927n may each include a transistor that when switched on by a corresponding control line connected to its gate, may remove the resistor from the resistive network, and when the transistor is switched off by the corresponding control line, the resistor may be added to the resistive network. Thus, the shift current (I_shift) may be a function of which resistors (e.g., R0, R1, R2, . . . , Rn) have been added to the resistive network based on its corresponding control line (e.g., D0, D1, D2, . . . , Dn). As should be appreciated, although four switchable circuits have been depicted, any number of switchable circuits may be used to define the variable resistance of, e.g., resistive element 927. As should also be appreciated, any type of control mechanism may be used to provide the resistor selection signal and/or to set the variable resistance of a variable resistive element such as resistive element 927. It is important to note that it may be advantageous for resistive elements 926, 927 (e.g., R, R0, R1, R2, . . . , Rn) to have a very small temperature coefficient so as to provide a shift current that has minimal variation caused by the resistive elements over the operating temperature of the memory.

Figure 10:
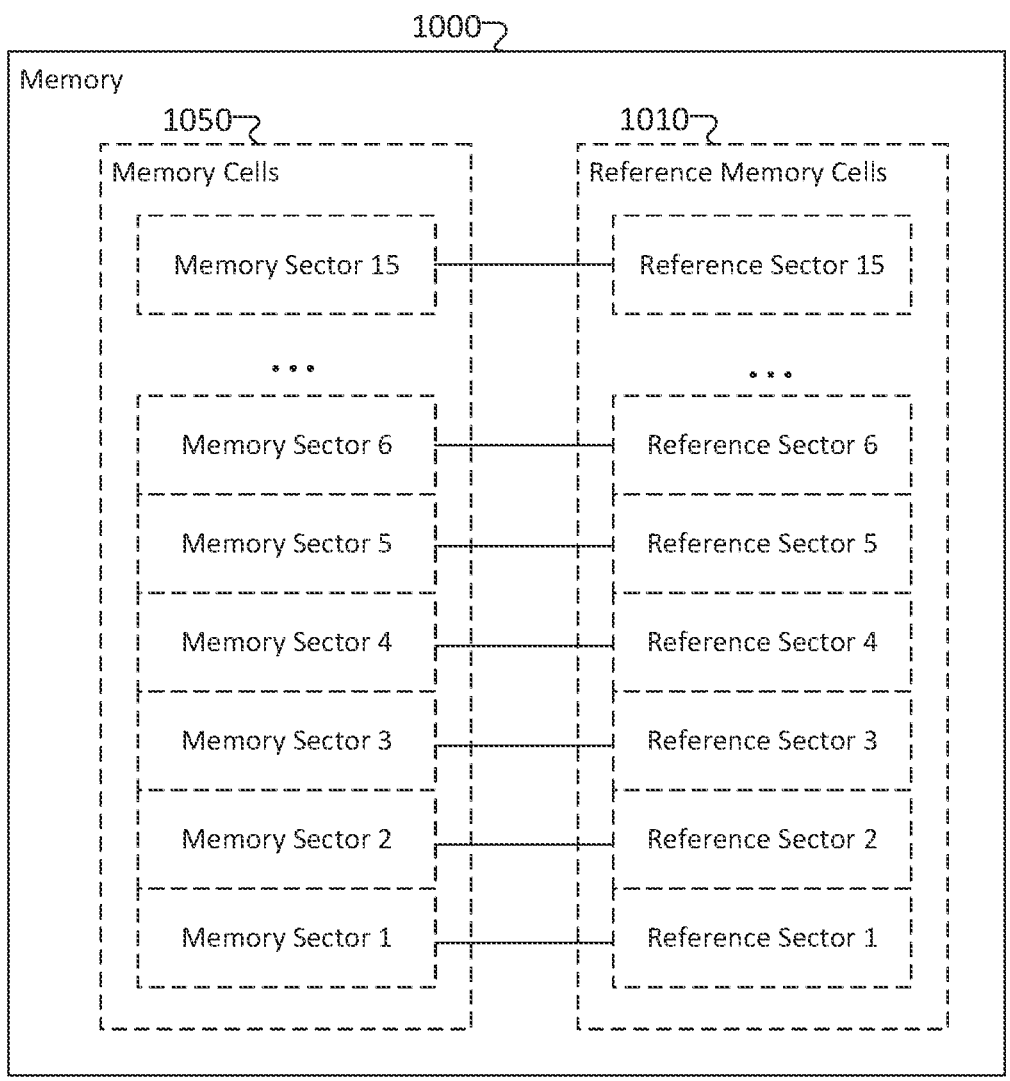
FIG. 10 shows an exemplary memory arrangement with memory cells that have been grouped into memory sectors with corresponding reference sectors.

FIG. 10 shows a memory 1000 that includes circuitry for generating a reference read current from reference elements 1010, wherein the reference read current may be provided to sense amplifiers (not pictured) for reading an array of memory cells 1050 of memory 1000. The array of memory cells 1050 may be organized into memory sectors that are configured to be read using a reference read current corresponding to the particular sector, such that each sector may be supplied by a different reference read current. The reference read current for the particular sector may be generated from a corresponding reference sector composed of a subset of reference memory cells 1010 designated for providing reference read current to the particular memory sector. By grouping the reference memory cells 1010 into sectors that are used for generating the reference read current for the corresponding memory sector, such a grouping may reduce the potential for a read disturb that may otherwise occur if the same reference memory cells were used as the reference sector for the entire array of memory cells 1050 of memory 1000 (e.g., cycling the same reference memory cells for a large amount of time may cause the current-voltage transfer characteristics of the reference sector to shift disproportionately in comparison to the memory cells of the memory). As shown in the grouping example of FIG. 10, memory cells 1050 have been arranged into sixteen memory sectors and the reference memory cells 1010 have been arranged into sixteen reference sectors. In such a grouped configuration, each time a new memory sector is selected for a read operation, the memory 1000 may use the corresponding reference sector to supply the reference read current for the read operation (e.g., reading from memory sector 15 may use reference sector 15 to supply the reference read current; reading from memory sector 1 may use reference sector 1 to supply the reference read current, etc.).

In addition, memory 1000 may be configured to read from or write to each of the reference memory cells of the corresponding reference sector each time a memory cell in the corresponding memory sector is read from or written to. For example, each time the memory cells are read, a "read" operation may be performed on the corresponding reference memory cells. As another example, each time the memory cells are written, the corresponding reference memory cells are also written (e.g., programmed to a predefined one of its memory states (e.g., to a logic "1" (LVT state) or a logic "0" (HVT state)). In this manner, the reference memory cells may be programmed the same number of times as the corresponding memory sector, so that changes over time in the current-voltage transfer characteristics of the memory sector (e.g., changes that may occur due to use/aging) may also be experienced by its corresponding reference memory cells. As such, changes in the current-voltage transfer characteristics of the reference memory cells will follow the changes in the current-voltage transfer characteristics of the memory cells. As should be appreciated, this may be done on a sector-by-sector basis, as discussed above, such that a read/write operation of a given memory sector will also cause a read/write operation to the corresponding sector of reference memory cells.

In addition, it should be noted that during such a "write" operation of the reference memory cells, each reference memory cell of the set of reference memory cells need not necessarily be programmed to its same predefined memory state. However, the number of reference memory cells in the set that were programmed to each of the predefined states should remain the same. For example, if there are 16 reference memory cells in a reference sector, where 15 reference memory cells are predefined to be programmed to the LVT state and 1 reference memory cell is programmed to the HVT state, during a "write" operation, the number of reference memory cells programmed to the LVT state should remain at 15 and the number of reference memory cells programmed to the HVT state should remain at 1, irrespective of which reference memory cells are actually programmed to each predefined state.

Figure 11:
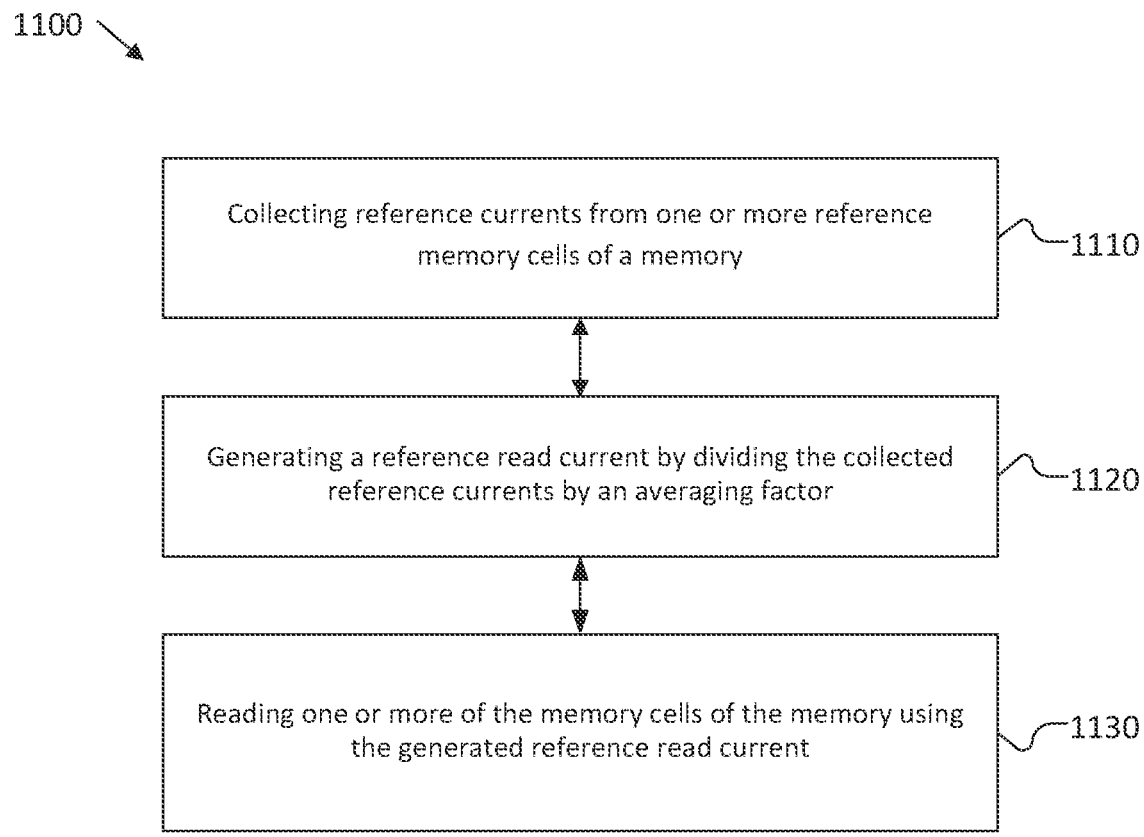
FIG. 11 depicts an exemplary schematic flow diagram of a method for supplying a reference read current for a memory.

FIG. 11 depicts an exemplary schematic flow diagram of a method 1100 for providing a reference read current for reading memory cells of a memory. Method 1100 may implement any of the features and/or structures described above with respect to the memory arrangements described above, including with reference to FIGS. 7-10.

Method 1100 includes, in step 1110, collecting a plurality of reference currents from one or more reference memory cells of a memory. Method 1100 also includes, in step 1120, dividing the collected plurality of reference sector currents by an averaging factor to provide a reference read current. Method 1100 also includes, in step 1130, reading one or more of the memory cells of the memory using the provided reference read current.

In the following, various examples are provided that may include one or more aspects described above with reference to memory arrangements that provide a reference read current for reading memory cells of a memory. It may be intended that aspects described in relation to the circuits may apply also to the described method(s), and vice versa.

Example 1 is a memory cell arrangement including a plurality of memory cells, one or more reference memory cells, and a reference circuit configured to provide a reference read current for reading one or more of the plurality memory cells, wherein the reference circuit is connected to the one or more reference memory cells to generate the reference read current based on one or more reference currents provided by the one or more reference memory cells.

Example 2 is the memory cell arrangement of example 1, the memory cell arrangement further including a shifting circuit connected to the reference circuit, wherein the shifting circuit is configured to shift the reference read current.

Example 3 is the memory cell arrangement of example 2, wherein the shifting circuit is configured to shift the reference read current based on an injected shift current.

Example 4 is the memory cell arrangement of any one of examples 1 to 3, wherein the reference circuit is connected to the one or more reference memory cells at a reference current node, wherein the one or more reference memory cells are configured to provide the one or more reference currents to the reference current node.

Example 5 is the memory cell arrangement of example 4, wherein a shifting circuit is configured to inject an injected shift current to the reference current node.

Example 6 is the memory cell arrangement of any one of examples 1 to 5, wherein at least one of the plurality of memory cells and the one or more reference memory cells include a state-programmable memory element that is programmable to at least two different programming states.

Example 7 is the memory cell arrangement of example 6, wherein the state-programmable memory element includes a spontaneously polarizable field effect transistor.

Example 8 is the memory cell arrangement of either of examples 6 or 7, wherein the at least two programming states include a low threshold voltage (LVT) state and a high threshold voltage (HVT) state.

Example 9 is the memory cell arrangement of any one of examples 1 to 8, wherein each of the one or more reference currents include a bias current of a corresponding reference memory cell of the one or more reference memory cells.

Example 10 is the memory cell arrangement of any one of examples 1 to 9, wherein the one or more reference memory cells are programmable between at least two different programming states (e.g., LVT or HVT), wherein each of the one or more reference memory cells is programmed to a corresponding predefined programming state from among the at least two different programming states.

Example 11 is the memory cell arrangement of example 10, wherein the corresponding predefined programming state for one of the one or more reference memory cells is different from another of the one or more reference memory cells.

Example 12 is the memory cell arrangement of either of examples 10 or 11, the memory cell arrangement configured to write (e.g., to "erase" or to "program") the corresponding predefined programming state to each memory cell of the one or more reference memory cells each time at least one of the plurality of memory cells is written (e.g., "erased" or "programmed").

Example 13 is the memory cell arrangement of any one of examples 1 to 12, wherein the one or more reference currents are associated with a number of the one or more reference memory cells programmed to a first of two different programming states (e.g., LVT or HVT) and a remaining number of the one or more reference memory cells programmed to a second of the two different programming states, wherein the memory cell arrangement is configured to, each time the at least one of the plurality of memory cells is written (e.g., to "erase" or to "program"), write the same number of the one or more reference memory cells to the first of the two different programming states and write the same remaining number of the one or more reference memory cells to the second of the two different programming states.

Example 14 is the memory cell arrangement of any of examples 1 to 13, wherein the memory cell arrangement is configured to perform a read operation on the one or more reference memory cells each time at least one of the plurality of memory cells is read.

Example 15 is the memory cell arrangement of example 2, wherein the shifting circuit includes a configurable resistive network.

Example 16 is the memory cell arrangement of example 15, wherein the injected shift current is based on a configured resistance value of the configurable resistive network.

Example 17 is the memory cell arrangement of example 16, wherein the configured resistance value of the configurable resistive network is configurable based on a resistor selection signal that sets the configured resistance value of the configurable resistive network.

Example 18 is the memory cell arrangement of either of examples 16 or 17, wherein the configurable resistive network includes a plurality of resistor circuits connected in series, wherein each resistor circuit of the plurality of resistor circuits is configurable between an included state and an excluded state, wherein the injected shift current depends on which of the plurality of resistor circuits are configured to the included state.

Example 19 is the memory cell arrangement of example 18, wherein the plurality of selective-resistor circuits are configurable to the included state or the excluded state based on the resistor selection signal.

Example 20 is the memory cell arrangement of example 16, wherein the shifting circuit includes a first transistor and a second transistor connected in a current mirror configuration to the configurable resistive network.

Example 21 is the memory cell arrangement of any one of examples 1 to 20, wherein the reference circuit includes a first transistor and a second transistor connected in a current mirror configuration, wherein the reference read current is based on a ratio between a width of the first transistor and a width of the second transistor.

Example 22 is a memory device including a memory sector including a plurality of memory cells, a reference sector including a plurality of reference memory cells, wherein each of the plurality of reference memory cells is configured to provide a corresponding reference current to an averaging node as a collected reference current, and a dividing circuit connected to the averaging node, wherein the dividing circuit is configured to generate an averaged reference read current based on dividing the collected reference current by an averaging factor.

Example 23 is the memory device of example 22, the memory device further including a shifting circuit configured to inject a shift current into the averaging node in order to shift the averaged reference read current.

Example 24 is the memory device of example 23, wherein the shifting circuit is configured to shift the collected read current based on an injected shift current.

Example 25 is the memory device of any one of examples 22 to 24, wherein the dividing circuit is configured to provide the averaged reference read current to the memory sector for reading at least one of the plurality of memory cells.

Example 26 is the memory device of example 25, wherein a shifting circuit is configured to inject an injected shift current to the averaging node.

Example 27 is the memory device of any one of examples 22 to 26, wherein at least one of the plurality of memory cells and the one or more reference memory cells include a state-programmable memory element that is programmable to at least two different programming states.

Example 28 is the memory device of example 27, wherein the state-programmable memory element includes a spontaneously polarizable field effect transistor.

Example 29 is the memory device of either of examples 27 or 28, wherein the at least two programming states include a low threshold voltage (LVT) state and a high threshold voltage (HVT) state.

Example 30 is the memory device of any one of examples 22 to 29, wherein the corresponding reference current includes a bias current of a corresponding reference memory cell of the plurality of reference memory cells.

Example 31 is the memory device of any one of examples 22 to 30, wherein the plurality of reference memory cells are programmable between at least two different programming states (e.g., LVT or HVT), wherein each memory cell of the plurality reference memory cells is programmed to a corresponding predefined programming state from among the at least two different programming states.

Example 32 is the memory device of example 31, wherein the corresponding predefined programming state for one of the plurality of reference memory cells is different from another of the plurality of reference memory cells.

Example 33 is the memory device of either of examples 31 or 32, the memory cell arrangement configured to write (e.g., to "erase" or to "program") the corresponding predefined programming state to each memory cell of the plurality reference memory cells each time at least one of the plurality of memory cells is written (e.g., "erased" or "programmed").

Example 34 is the memory device of any one of examples 22 to 33, wherein the corresponding reference current is associated with a number of the plurality reference memory cells programmed to a first of two different programming states (e.g., LVT or HVT) and a remaining number of the plurality of reference memory cells programmed to a second of the two different programming states, wherein the memory device is configured to, each time the at least one of the plurality of memory cells is written (e.g., to "erase" or to "program"), write the same number of the plurality reference memory cells to the first of the two different programming states and write the same remaining number of the plurality of reference memory cells to the second of the two different programming states.

Example 35 is the memory cell arrangement of any of examples 22 to 34, wherein the memory device is configured to perform a read operation on the plurality of reference memory cells each time at least one of the plurality of memory cells is read.

Example 36 is the memory cell arrangement of example 23, wherein the shifting circuit includes a configurable resistive network.

Example 37 is the memory cell arrangement of example 36, wherein the injected shift current is based on a configured resistance value of the configurable resistive network.

Example 38 is the memory cell arrangement of example 37, wherein the configured resistance value of the configurable resistive network is configurable based on a resistor selection signal that sets the configured resistance value of the configurable resistive network.

Example 39 is the memory cell arrangement of either of examples 37 or 38, wherein the configurable resistive network includes a plurality of resistor circuits connected in series, wherein each resistor circuit of the plurality of resistor circuits is configurable between an included state and an excluded state, wherein the injected shift current depends on which of the plurality of resistor circuits are configured to the included state.

Example 40 is the memory cell arrangement of example 39, wherein the plurality of selective-resistor circuits are configurable to the included state or the excluded state based on the resistor selection signal.

Example 41 is the memory cell arrangement of example 37, wherein the shifting circuit includes a first transistor and a second transistor connected in a current mirror configuration to the configurable resistive network.

Example 42 is the memory cell arrangement of any one of examples 22 to 41, wherein the reference circuit includes a first transistor and a second transistor connected in a current mirror configuration, wherein the averaged reference read current is based on a ratio between a width of the first transistor and a width of the second transistor.

Example 43 is a memory device including a plurality of memory sectors, wherein each memory sector of the plurality of memory sectors includes a plurality of memory cells, a plurality of reference sectors, wherein each reference sector of the plurality of reference sectors includes a plurality of reference memory cells, wherein each of the plurality of reference memory cells is configured to provide a corresponding reference current to an averaging node of the reference sector as a collected reference current of the reference sector, and a dividing circuit connected the plurality of reference sectors, wherein the dividing circuit is configured to generate from each reference sector of the plurality reference sectors an averaged reference read current based on dividing the collected reference current from the averaging node of the reference sector by an averaging factor and provide the averaged reference read current to a corresponding memory sector of the plurality of memory sectors for reading at least one memory cell of the corresponding memory sector.

Example 44 is the memory device of example 43, the memory device further including a shifting circuit for each reference sector configured to inject a shift current into the averaging node of the reference sector in order to shift the collected reference current of the reference sector.

Example 45 is the memory device of example 44, wherein the shifting circuit is configured to shift the averaged reference read current based on an injected shift current.

Example 46 is the memory device of example 45, wherein the shifting circuit is configured to inject the injected shift current into the averaging node of the reference sector.

Example 47 is the memory device of any one of examples 43 to 46, wherein at least one of the plurality of memory cells and at least one of the plurality of reference memory cells include a state-programmable memory element that is programmable to at least two different programming states.

Example 48 is the memory device of example 47, wherein the state-programmable memory element includes a spontaneously polarizable field effect transistor.

Example 49 is the memory device of either of examples 47 or 48, wherein the at least two programming states include a low threshold voltage (LVT) state and a high threshold voltage (HVT) state.

Example 50 is the memory device of any one of examples 43 to 49, wherein the corresponding reference current includes a bias current of a corresponding reference memory cell of the plurality of reference memory cells for a sector of the plurality of sectors.

Example 51 is the memory device of any one of examples 43 to 50, wherein the plurality of reference memory cells of a sector of the plurality of sectors are programmable between at least two different programming states (e.g., LVT or HVT), wherein each of the plurality of reference memory cells is programmed to a corresponding predefined programming state from among the at least two different programming states.

Example 52 is the memory device of example 51, wherein the corresponding predefined programming state for one of the plurality of reference memory cells of a sector of the plurality of sectors is different from another of the plurality of reference memory cells of the sector.

Example 53 is the memory device of either of examples 51 or 52, the memory device configured to write (e.g., to "erase" or to "program") the corresponding predefined programming state to each memory cell of the plurality of reference memory cells for the sector each time at least one of the plurality of memory cells is written (e.g., "erased" or "programmed") for a memory sector of the plurality of memory sectors.

Example 54 is the memory device of any one of examples 43 to 53, wherein the corresponding reference current is associated with a number of the plurality of reference memory cells for a sector of the plurality of sectors that are programmed to a first of two different programming states (e.g., LVT or HVT) and a remaining number of the plurality of reference memory cells for the sector are programmed to a second of the two different programming states, wherein the memory device is configured to, each time the plurality of memory cells for the corresponding memory sector is written (e.g., to "erase" or to "program"), write the same number of the plurality of reference memory cells of the sector to the first of the two different programming states and write the same remaining number of the plurality of reference memory cells of the sector to the second of the two different programming states.

Example 55 is the memory device of any of examples 43 to 54, wherein the memory device is configured to perform a read operation on the plurality of reference memory cells for a sector of the plurality of reference sectors each time at least one of the plurality of memory cells of the corresponding sector is read.

Example 56 is the memory device of example 44, wherein the shifting circuit includes a configurable resistive network.

Example 57 is the memory device of example 56, wherein the injected shift current is based on a configured resistance value of the configurable resistive network.

Example 58 is the memory device of example 57, wherein the configured resistance value of the configurable resistive network is configurable based on a resistor selection signal that sets the configured resistance value of the configurable resistive network.

Example 59 is the memory device of either of examples 57 or 58, wherein the configurable resistive network includes a plurality of resistor circuits connected in series, wherein each resistor circuit of the plurality of resistor circuits is configurable between an included state and an excluded state, wherein the injected shift current depends on which of the plurality of resistor circuits are configured to the included state.

Example 60 is the memory device of example 59, wherein the plurality of selective-resistor circuits are configurable to the included state or the excluded state based on the resistor selection signal.

Example 61 is the memory device of example 57, wherein the shifting circuit includes a first transistor and a second transistor connected in a current mirror configuration to the configurable resistive network.

Example 62 is the memory device of any one of examples 43 to 61, wherein the reference circuit includes a first transistor and a second transistor connected in a current mirror configuration, wherein the averaged reference read current is based on a ratio between a width of the first transistor and a width of the second transistor.

Example 63 is a method for reading memory cells of a memory, the method including collecting reference sector currents from one or more reference memory cells of the memory, generating a reference read current by dividing the collected reference sector currents by an averaging factor, and reading one or more of the memory cells of the memory using the generated reference read current.

Example 64 is the method of example 63, the method further including injecting a shift current into the collected reference sector currents.

Example 65 is the method of any one of examples 63 to 64, wherein collecting the reference sector currents includes collecting the reference sector currents at a reference current node.

Example 66 is the method of example 65, wherein injecting the shifting circuit includes injecting the shift current to the reference current node.

Example 67 is the method of any one of examples 63 to 66, wherein at least one of the memory cells and at least one of the one or more reference memory cells include a state-programmable memory element that is programmable to at least two different programming states.

Example 68 is the method of example 67, wherein the state-programmable memory element includes a spontaneously polarizable field effect transistor.

Example 69 is the method of either of examples 67 or 68, wherein the at least two programming states include a low threshold voltage (LVT) state and a high threshold voltage (HVT) state.

Example 70 is the method of any one of examples 63 to 69, wherein collecting the reference sector currents includes collecting bias currents of the one or more reference memory cells.

Example 71 is the method of any one of examples 63 to 70, wherein the one or more reference memory cells are programmable between at least two different programming states (e.g., LVT or HVT), wherein the method further includes programming each of the one or more reference memory cells to a predefined programming state from among the at least two different programming states.

Example 72 is the method of example 71, wherein programming each of the one or more reference cells to the predefined programming state includes programming at least one of the one or more reference memory cells to one of the at least two different programming states and programming another of the one or more reference memory cells to another of the at least two different programming states that is different from the one.

Example 73 is the method of either of examples 71 or 72, the method further including writing at least one of the one or more memory cells, wherein the programming each of the one or more reference memory cells to the predefined programming state includes writing (e.g., "erasing" or to "programming") the predefined programming state to the one or more reference memory cells each time one of the one or more memory cells is written (e.g., "erased" or "programmed").

Example 74 is the method of any one of examples 63 to 73, the method further including programming a number of the one or more reference memory cells to a first of two different programming states (e.g., LVT or HVT) and programming a remaining number of the one or more reference memory cells to a second of the two different programming states, wherein each time at least one of the plurality of memory cells is written (e.g., to "erase" or to "program"), writing the same number of the one or more reference memory cells to the first of the two different programming states and writing the same remaining number of the one or more reference memory cells to the second of the two different programming states.

Example 75 is the method of any of examples 63 to 74, the method further including reading the one or more reference memory cells each time at least one of the memory cells is read.

Example 76 is the method of example 64, wherein injecting the shift current includes determining the injected shift current based on a configurable resistive network.

Example 77 is the method of example 76, wherein determining the injected shift current includes determining the injected shift current based on a configured resistance value of the configurable resistive network.

Example 78 is the method arrangement of example 77, wherein the configured resistance value of the configurable resistive network is configurable based on a resistor selection signal that sets the configured resistance value of the configurable resistive network.

Example 79 is the method of either of examples 77 or 78, wherein the configurable resistive network includes a plurality of resistor circuits connected in series, wherein each resistor circuit of the plurality of resistor circuits is configurable between an included state and an excluded state, the method further including determining the injected shift current based on which of the plurality of resistor circuits are configured to the included state.

Example 80 is the method of example 79, the method further including setting the plurality of selective-resistor circuits to the included state or the excluded state based on receiving the resistor selection signal.

Example 81 is the method of example 77, wherein determining the injected shifting current is based on a first transistor and a second transistor connected in a current mirror configuration to the configurable resistive network.

Example 82 is the method of any one of examples 63 to 81, wherein the generated reference read current is based on width of a first transistor and a width of a second transistor, wherein the first transistor and the second transistor are connected in a current mirror configuration.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

The invention claimed is:

1. A memory cell arrangement comprising:
a plurality of memory cells;
one or more reference memory cells;
a reference circuit comprising a first transistor and a second transistor connected in a current mirror configuration configured to provide a reference read current for reading one or more of the plurality memory cells, wherein the reference circuit is connected to the one or more reference memory cells to generate the reference read current based on one or more reference currents accumulated at an averaging node from the one or more reference memory cells and based on a ratio between a width of the first transistor and a width of the second transistor; and
a shifting circuit configured to inject a shift current into the averaging node in order to shift the one or more reference currents accumulated at the averaging node by the shift current, wherein the shifting circuit comprises a configurable resistive network, wherein the shift current is based on a configured resistance value of the configurable resistive network.

2. The memory cell arrangement of claim 1, the memory cell arrangement further comprising a shifting circuit connected to the reference circuit, wherein the shifting circuit is configured to shift the reference read current.

3. The memory cell arrangement of claim 2, wherein the shifting circuit is configured to shift the reference read current based on an injected shift current.

4. The memory cell arrangement of claim 1, wherein the reference circuit is connected to the one or more reference memory cells at a reference current node, wherein the one or more reference memory cells are configured to provide the one or more reference currents to the reference current node.

5. The memory cell arrangement of claim 4, wherein a shifting circuit is configured to inject an injected shift current to the reference current node.

6. The memory cell arrangement of claim 1, wherein at least one of the plurality of memory cells and the one or more reference memory cells comprise a state-programmable memory element that is programmable to at least two different programming states.

7. The memory cell arrangement of claim 6, wherein the state-programmable memory element comprises a spontaneously polarizable field effect transistor, wherein the at least two programming states comprise a low threshold voltage (LVT) state and a high threshold voltage (HVT) state.

8. The memory cell arrangement of claim 1, wherein the one or more reference currents comprise bias currents of the one or more reference memory cells.

9. The memory cell arrangement of claim 1, wherein each reference memory cell of the one or more reference memory cells is programmed to a corresponding predefined programming state from among at least two different programming states.

10. The memory cell arrangement of claim 9, the memory cell arrangement configured to write the corresponding predefined programming state to each reference memory cell each time at least one of the plurality of memory cells is written.

11. The memory cell arrangement of claim 1, wherein the memory cell arrangement is configured to perform a read operation on the one or more reference memory cells each time at least one of the plurality of memory cells is read.

12. A memory device comprising:
a memory sector comprising a plurality of memory cells;
a reference sector comprising a plurality of reference memory cells, wherein each of the plurality of reference memory cells is configured to provide a corresponding reference current to an averaging node as a collected reference current;
a dividing circuit connected to the averaging node, wherein the dividing circuit is configured to generate an averaged reference read current based on dividing the collected reference current by an averaging factor; and
a shifting circuit configured to inject a shift current into the averaging node in order to shift the averaged reference read current based on the injected shift current, wherein the shifting circuit comprises a configurable resistive network, wherein the injected shift current is based on a configured resistance value of the configurable resistive network.

13. The memory device of claim 12, wherein the configured resistance value of the configurable resistive network is configurable based on a resistor selection signal that sets the configured resistance value of the configurable resistive network.

14. The memory device of claim 12, wherein the configurable resistive network comprises a plurality of resistor circuits connected in series, wherein each resistor circuit of the plurality of resistor circuits is configurable between an included state and an excluded state, wherein the injected shift current depends on which of the plurality of resistor circuits are configured to the included state.

15. The memory device of claim 14, wherein the plurality of resistor circuits are configurable to the included state or the excluded state based on a resistor selection signal.

16. The memory device of claim 12, wherein the shifting circuit comprises a first transistor and a second transistor connected in a current mirror configuration to the configurable resistive network.

17. A method for reading memory cells of a memory, the method comprising:
collecting reference sector currents from one or more reference memory cells of the memory;
generating a reference read current by:
dividing the collected reference sector currents by an averaging factor to generate an averaged reference read current; and
injecting a shift current in order to shift the averaged reference read current based on the injected shift current, wherein the injected shift current is based on a configured resistance value of a configurable resistive network; and
reading one or more of the memory cells of the memory using the generated reference read current.

* * * * *